United States Patent
Sudo et al.

(10) Patent No.: US 9,266,763 B2
(45) Date of Patent: Feb. 23, 2016

(54) COMPOSITE CRUCIBLE AND METHOD OF MANUFACTURING THE SAME

(75) Inventors: Toshiaki Sudo, Akita (JP); Ken Kitahara, Akita (JP); Takuma Yoshioka, Akita (JP)

(73) Assignee: SUMCO CORPORATION, Tokyo (JP)

( * ) Notice: Subject to any disclaimer, the term of this patent is extended or adjusted under 35 U.S.C. 154(b) by 1067 days.

(21) Appl. No.: 13/335,778

(22) Filed: Dec. 22, 2011

(65) Prior Publication Data

US 2012/0160158 A1 Jun. 28, 2012

(30) Foreign Application Priority Data

Dec. 28, 2010 (JP) ................. 2010-293567

(51) Int. Cl.
| | |
|---|---|
| C03B 19/06 | (2006.01) |
| C03B 19/09 | (2006.01) |
| C30B 15/10 | (2006.01) |
| C30B 29/06 | (2006.01) |
| C30B 35/00 | (2006.01) |

(52) U.S. Cl.
CPC .............. C03B 19/095 (2013.01); C30B 15/10 (2013.01); C30B 29/06 (2013.01); C30B 35/002 (2013.01); Y10T 117/10 (2015.01)

(58) Field of Classification Search
CPC combination set(s) only.
See application file for complete search history.

(56) References Cited

U.S. PATENT DOCUMENTS

| | | | |
|---|---|---|---|
| 4,956,208 A * | 9/1990 | Uchikawa et al. | ........... 428/34.6 |
| 5,917,103 A | 6/1999 | Watanabe et al. | |
| 5,980,629 A | 11/1999 | Hansen et al. | |
| 2004/0115440 A1 | 6/2004 | Werdecker et al. | |
| 2006/0016389 A1 | 1/2006 | Holder et al. | |
| 2008/0141929 A1 * | 6/2008 | Kemmochi et al. | ........... 117/208 |
| 2010/0112115 A1 | 5/2010 | Yoshioka et al. | |
| 2010/0139549 A1 | 6/2010 | Sakurada et al. | |
| 2010/0236473 A1 | 9/2010 | Kishi | |
| 2010/0251959 A1 | 10/2010 | Kodama et al. | |

FOREIGN PATENT DOCUMENTS

| | | |
|---|---|---|
| CN | 101857969 A | 10/2010 |
| EP | 0745705 A1 | 12/1996 |
| EP | 0753605 A1 | 1/1997 |
| EP | 1086936 A2 | 3/2001 |
| EP | 2202335 A1 | 6/2010 |

(Continued)

OTHER PUBLICATIONS

Chinese First Office Action issued by the State Intellectual Property Office of China, issued on Apr. 1, 2014, for Chinese counterpart application No. 201110445464.X.

(Continued)

*Primary Examiner* — Duy Deo
*Assistant Examiner* — Erin Bergner
(74) *Attorney, Agent, or Firm* — Law Office of Katsuhiro Arai

(57) ABSTRACT

The purpose of the present invention is to provide a crucible which has high viscosity at high temperature, can be used for a long time, and can be manufactured at low cost, and a method of manufacturing the crucible. The present invention provides a composite crucible including a vitreous silica crucible body having a sidewall portion and a bottom portion, and a reinforcement layer provided on an outer surface side of an upper end portion of the vitreous silica crucible body, wherein the reinforcement layer is made of mullite material whose main component is alumina and silica.

3 Claims, 7 Drawing Sheets

(56) References Cited

FOREIGN PATENT DOCUMENTS

| | | |
|---|---|---|
| JP | 01-153579 A | 6/1989 |
| JP | 2000-247778 A | 9/2000 |
| JP | 2004-531449 A | 10/2004 |
| JP | 2005-330157 A | 12/2005 |
| JP | 2008-507467 A | 3/2008 |
| TW | 201016902 A | 5/2010 |

OTHER PUBLICATIONS

Extended European Search Report (EESR) mailed Jul. 17, 2012, issued in corresponding Application No. EP 11195427.7.
Taiwan Office action, mailed Oct. 22, 2013, for Taiwan counterpart application No. 100149385.

* cited by examiner

COMPOSITE CRUCIBLE AND METHOD OF MANUFACTURING THE SAME

CROSS-REFERENCE TO RELATED APPLICATION

This application is related to Japanese Patent Application No. 2010-293567 filed on Dec. 28, 2010, whose priority is claimed and the disclosure of which is incorporated by reference in its entirety.

BACKGROUND OF THE INVENTION

1. Field of the Invention

The present invention relates to a composite crucible used for manufacturing a silicon crystal, and a method of manufacturing the crucible.

2. Description of the Related Art

Nowadays, the demand for a solar cell has been increasing in consideration of environment problem and energy problem. The solar cell is generally classified into a silicon solar cell and a compound semiconductor solar cell, based on the kind of the semiconductor used for the power generation part. Furthermore, the silicon solar cell is classified into a crystalline silicon solar cell and an amorphous silicon solar cell. The crystalline silicon solar cell is classified into a monocrystalline silicon solar cell and a polycrystalline silicon solar cell.

Regarding conversion efficiency which is the most important aspect for a solar cell, nowadays, the compound semiconductor solar cell has reached nearly 25%, which is the highest, and the monocrystalline silicon solar cell is about 20%, and the polycrystalline silicon solar cell and the amorphous silicon solar cell are 5 to 15%. Regarding the raw material cost, silicon is an element which is the second most abundant on the earth (oxygen is the most abundant), and thus much cheaper than compound semiconductor, and thus silicon solar cell is most widely used. The conversion efficiency refers to a ratio of the energy converted to electrical energy by the solar cell with respect to the energy of the incoming light into the solar cell. The ratio is represented by "percentage (%)".

Next, a method of manufacturing a monocrystalline silicon solar cell will be explained briefly. First, a cylindrical silicon single crystal ingot is manufactured by the Czochralski method (the CZ method) or the floating zone melting method (the FZ method). For example, in the CZ method, polycrystalline silicon is supplied into a vitreous silica crucible, followed by melting by heating. Then, a seed crystal is dipped into the obtained silicon melt, and gradually pulled up, to produce a silicon single crystal.

Then, the ingot is sliced to obtain thin wafers each having a thickness of, for example, 300 μm. The surface of the obtained wafer is etched by a chemical to remove processing strain in the surface, to obtain a wafer (substrate) for a solar cell. An Impurity (dopant) is diffused into the wafer to form a PN junction on one side of the wafer, and then electrodes are formed on both sides, and thereafter an antireflection film is formed on the sunlight incidence plane to reduce light energy loss due to light reflection, to obtain the solar cell. In the solar cell, in order to increase the current, it is important to manufacture a solar cell having a larger area. The CZ method is excellent in that it allows easy production of a silicon single crystal having a large diameter, and the obtained single crystal is excellent in the strength. Therefore, this method is preferred as a method of obtaining a silicon wafer, having a large diameter, which is a substrate material for manufacturing a large-area solar cell.

On the other hand, in the manufacturing of the polycrystalline silicon solar cell, it is preferred to use the casting method where silicon melt is solidified in the mold, or the electromagnetic casting method which is a continuous casting method by electromagnetic induction. By use of such method, it is possible to manufacture a substrate material at lower cost than single crystal silicon substrate, which is manufactured by the CZ method. In the casting method, high-purity silicon is heated and melted in a crucible, and a small amount of boron (which is a dopant) and the like is uniformly added thereto, and the silicon melt is solidified therein or solidified after the silicon melt is introduced into a mold. It is required that the crucible and the mold used for the casting method are excellent in heat resistance and shape stability, and in addition low impurity content is also demanded. So, the crucible is made of silica, and the mold is made of graphite.

The vitreous silica crucible used for manufacturing a silicon crystal is required to have high viscosity at high temperature in order to be durable enough for long-time and multiple pulling or casting. Furthermore, the vitreous silica crucible is required to be manufactured at low cost. As a conventional crucible having high strength at high temperature, there are known a crucible having a layer containing aluminium (Al) in high concentration at the outer surface side, a crucible obtained by coating a crystallization promoter (e.g. barium (Ba)) on the outer surface, and a crucible having, on the outer surface, a stabilization layer made of alumina, mullite, or the like (See JP-A-2000-247778, JP-A-2008-507467, and JP-A-2004-531449). Another related reference is JP-A-H1-153579.

SUMMARY OF THE INVENTION

The conventional crucible having the layer containing aluminium (Al) in high concentration has relatively high viscosity, but the high temperature strength is not sufficient. Furthermore, the crucible obtained by coating barium, as a crystallization promoter, onto a surface can be strengthen by the crystallization of the crucible surface, but the coating requires time and effort, and the handling of the toxic barium is problematic. Furthermore, in the conventional crucible having the stabilization layer on the outer surface, the stabilization layer is formed in a thickness of about 1 mm by the thermal spraying method, and further improvement in strength has been demanded.

Therefore, the purpose of the present invention is to provide a crucible which has high viscosity at high temperature, can be used for a long time, and can be manufactured at low cost, and there is also provided a method of manufacturing the crucible.

The present inventors have made extensive research on the aforementioned problem, and found out that it is possible to improve the durability of a crucible by providing a mullite reinforcement layer at the upper end portion of a vitreous silica crucible. When a vitreous silica crucible is used for a long time, inward sagging of the sidewall of the crucible can occur. However, when the reinforcement layer is provided on the upper end portion, such inward sagging can be prevented. Furthermore, there might be an idea of forming the whole or a large portion of the crucible by use of mullite material. When a vitreous silica layer is provided on the inner surface, the difference in the thermal expansion coefficient between mullite and vitreous silica can cause formation of cracks in the crucible during heating the crucible. However, when the reinforcement layer is formed only on the rim upper end portion, no cracks are formed in the crucible, and thus long-time use is made possible.

The present invention has been made based on such technical findings, and provides a composite crucible comprising a vitreous silica crucible body having a sidewall portion and a bottom portion, and a reinforcement layer provided on an outer surface side of an upper end portion of the vitreous silica crucible body, wherein the reinforcement layer is made of mullite material whose main component is alumina and silica.

According to the present invention, the mullite reinforcement layer is provided on the upper end portion of the vitreous silica crucible body, and thus high temperature strength of the upper end potion of the crucible can be improved. Therefore, the crucible strength can be maintained, and long-time use of the crucible is made possible. Furthermore, a large portion of the crucible is made of vitreous silica, and thus the composite crucible can be handled in the same way as the conventional vitreous silica crucible, and thus the handling is easy.

In the present invention, the height of the reinforcement layer is preferred to be 1/10 to 1/2 of the height of the sidewall portion. When the height of the reinforcement layer is less than 1/10 of the sidewall portion, the reinforcement layer does not work sufficiently and thus inward sagging of the sidewall portion can occur. When the height of the reinforcement layer is larger than 1/2 of the height of the sidewall portion, the difference in the thermal expansion coefficients between mullite and vitreous silica can cause formation of cracks in the crucible during heating the crucible.

In the present invention, it is preferred that the composite crucible further comprises a buffer layer between the reinforcement layer and the vitreous silica crucible body, and the buffer layer having concentration gradient of aluminium concentration which decreases from the above to the below of the crucible. According to this configuration, the mullite reinforcement layer and vitreous silica can be sufficiently strongly united vertically.

In the present invention, the vitreous silica crucible body is preferred to have an opaque vitreous silica layer, provided on the outer surface side of the crucible, containing numerous microbubbles and a transparent vitreous silica layer provided on the inner surface side of the crucible. The opaque vitreous silica layer enhances heat keeping effect of the crucible, and thus enables uniform heating of silicon melt. The transparent vitreous silica layer improves the manufacturing yield of a silicon single crystal.

In the present invention, the reinforcement layer may be provided on the same layer as the opaque vitreous silica layer with respect to the wall thickness direction of the crucible. Alternatively, the reinforcement layer may be provided on the outer side of the opaque vitreous silica layer in a way that the reinforcement layer contacts the outer surface of the opaque vitreous silica layer. In either case, the vitreous silica crucible body can be reinforced, and thus there can be provided a crucible which is not readily deformed even after long-time In the present invention, the concentration of the aluminium contained in the reinforcement layer is preferred to have concentration gradient which decreases from the outer surface side toward the inner surface side of the crucible. According to this configuration, the viscosity of the crucible on the outer surface side is sufficiently high, and the thermal expansion coefficient at a region near the inner surface is close to that to vitreous silica, and thus they are strongly united. In addition, impurity contamination of silicon melt in the crucible can be prevented.

Furthermore, the present invention provides a method of manufacturing a composite crucible comprising:

a process of, while rotating a mold having a cavity corresponding to a shape of a composite crucible, supplying mullite material powder containing alumina powder and silica powder to an upper region of the mold, and supplying second silica powder to a lower region provided below the upper region;

a process of supplying third silica powder on an inner surface side of a layer made of the mullite material powder and the second silica powder;

a process of heating and fusing the mullite material powder, the second silica powder, and the third silica powder to form an opaque vitreous silica layer provided on the outer surface of the crucible, a transparent vitreous silica layer provided on an inner surface side of the crucible, and a mullite reinforcement layer provided on the outer surface side of the crucible upper end portion.

Furthermore, the present invention provides a method of manufacturing a composite crucible comprising:

a process of forming a vitreous silica crucible body having a sidewall portion and a bottom portion;

a process of forming a mullite ring-shaped reinforcement member obtained by sintering a composition whose main component is alumina and silica;

a process of joining the reinforcement member on an outer surface side of the upper end portion of the vitreous silica crucible body.

Thus, according to the present invention, there is provided a crucible which has high strength at high temperature, can be used for a long time, and can be manufactured at low cost, and there is also provided a method of manufacturing the crucible.

DESCRIPTION OF THE PREFERRED EMBODIMENTS

Hereinafter, with reference to the attached drawings, preferred embodiments of the present invention will be explained.

Figure 1:
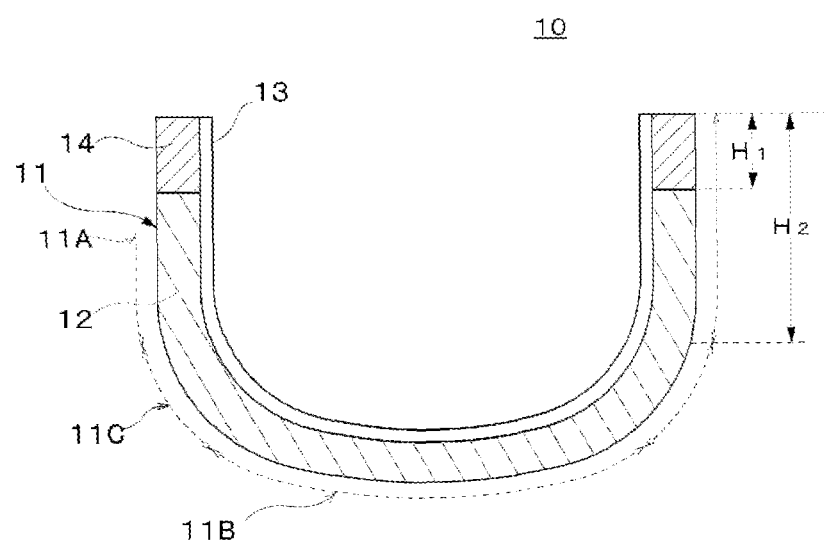
FIG. 1 is a sectional view schematically showing the structure of a composite crucible 10 according to a first embodiment of the present invention.

FIG. 1 is a schematic sectional view showing the structure of a composite crucible according to a first embodiment of the present invention.

As shown in FIG. 1, the composite crucible 10 includes a sidewall portion 11A and a bottom portion 11B, and has a basic shape as a container for keeping silicon melt therein. The sidewall portion 11A is a cylindrical portion parallel to the crucible central axis (Z axis). The bottom portion 11B is a relatively flat portion including a point of intersection with the crucible central axis. There is a corner portion 11C between the bottom portion 11B and the sidewall portion 11A. The corner portion 11C is a portion where the diameter in the sidewall portion 11A gradually decreases. The wall thickness of the crucible can vary depending on the portion in the crucible, but is preferred to be 5 mm or more. Usually, the thickness of mid-size or large-size crucibles whose opening diameter is 16 inches (approx. 400 mm) or more is 5 mm or more. Such crucible is preferably used for long time manufacturing, and thus the technical effect by the present invention is eminent in such crucible.

In one aspect of the present invention, the composite crucible 10 of the present embodiment includes a vitreous silica crucible as basic structure and mullite (e.g. $3Al_2O_3 \cdot 2SiO_2$) is used for a reinforcement member for the crucible.

Thus, the composite crucible 10 includes a vitreous silica crucible body 11 for keeping silicon melt therein, and a mullite reinforcement layer 14 provided on an upper end portion of the vitreous silica crucible body 11. A "composite crucible" means that the material for the crucible is not only vitreous silica as in a conventional crucible, but the material for the crucible is mullite and vitreous silica, thus composite. The name of "composite crucible" should not limit the scope of the present invention.

The vitreous silica crucible body 11 includes an opaque vitreous silica layer 12 provided on the outer side of the crucible, and a transparent vitreous silica layer 13 provided on the inner surface side of the crucible. As illustrated, the opaque vitreous silica layer 12 and the reinforcement layer 14 constitutes a crucible outer layer, and the transparent vitreous silica layer 13 constitutes a crucible inner layer covering the inner surface of the opaque vitreous silica layer 12 and the reinforcement layer 14.

The opaque vitreous silica layer 12 is amorphous vitreous silica layer incorporating numerous microbubbles. In the present specification, "opaque" refers to a state that numerous microbubbles exist in vitreous silica and the vitreous silica appears opaque. The opaque vitreous silica layer 12 has a function of uniformly conveying, to silicon melt in the crucible, heat from a heater disposed around the crucible. The opaque vitreous silica layer 12 has larger heat capacity than the transparent vitreous silica layer 13, and thus enables easy control of the temperature of silicon melt.

The bubble content rate of the opaque vitreous silica layer 12 is higher than the transparent vitreous silica layer 13, and is not in particular limited as long as it exerts the function, but is preferred to be 0.7% or more. When the bubble content rate of the opaque vitreous silica layer 12 is less than 0.7%, the opaque vitreous silica layer 12 does not properly function. The bubble content rate of the opaque vitreous silica layer 12 can be calculated from the specific gravity. An opaque vitreous silica piece having an unit volume (1 cm$^3$) is cut out from the crucible. When the mass is A, and the specific gravity for vitreous silica not containing bubbles is assumed to be B=2.21 g/cm$^3$, the bubble content rate is $P (\%) = (A/B) \ast 100$.

The transparent vitreous silica layer 13 is an amorphous vitreous silica layer substantially not containing bubbles. The transparent vitreous silica layer 13 prevents the increase of vitreous silica pieces detached from the crucible inner surface, and thus enhances silicon single crystallization yield. Here, "substantially not containing bubbles" refer to a state that the bubble content rate and the bubble size are such that the single crystallization yield is not deteriorated due to the bubbles. Although not in particular limited, it is preferred that the bubble content rate is 0.1% or less and the average diameter of the bubbles is 100 μm or less. The bubble content rate of the transparent vitreous silica layer can be measured non-destructively by use of an optical detection unit. As the optical detection unit, a light-receiving lens and an image pickup unit can be employed. In order to measure the bubble content rate from the surface to a certain depth, the focus of the light-receiving lens is scanned from the surface to the depth. The obtained image data is processed in an image processing device to calculate the bubble content rate.

The change of the bubble content rates from the opaque vitreous silica layer 12 to the transparent vitreous silica layer 13 is relatively abrupt. At a position approx. 30 μm from a position where the bubble content rate of the transparent vitreous silica layer 13 starts to increase, the bubble content rate reaches that of the opaque vitreous silica layer 12. Therefore, the boarder between the opaque vitreous silica layer 12 and the transparent vitreous silica layer 13 is clear and can be easily visually distinguished.

The transparent vitreous silica layer 13 may be made of natural vitreous silica or synthetic vitreous silica. Natural vitreous silica is vitreous silica manufactured from natural silica such as silica stone, natural quartz crystal. In general, natural silica contains metal impurities in higher concentration and OH group in lower concentration than synthetic silica. For example, for natural silica, the Al content is 1 ppm or more, and the content of each element of alkali metals (Na, K and Li) is 0.05 ppm or more, and the OH group content is less than 60 ppm. Natural silica has larger viscosity at high temperature than synthetic silica, and thus enhances the high temperature strength of the whole crucible. In addition, natural silica is cheaper than synthetic silica, and thus the use of natural silica is advantageous in terms of cost.

On the other hand, synthetic vitreous silica is vitreous silica manufactured from synthetic silica obtained, for example, by hydrolysis of silicon alkoxide. In general, synthetic silica contains metal impurities in lower concentration and OH group in higher concentration than natural silica. For example, for synthetic silica, the content of each element of metal impurities is less than 0.05 ppm, and the OH group content is 30 ppm or more. However, synthetic silica containing metal impurities such as Al is also known. Thus, whether silica is natural or synthetic needs to be determined based on plural factors. Synthetic vitreous silica contains impurities in much lower concentration than natural vitreous silica, and thus prevents the increase of impurities released into silicon melt from the crucible, and thus enhances silicon single crystallization yield.

The transparent vitreous silica layer 13 is preferred to contain each of alkali metals (Na, K and Li) in an amount of 0.05 ppm or less. This is because, when the crucible body 11 contains a large amount of alkali metals, the amount of impurities released into silicon melt from the crucible can increase, and the quality of silicon single crystal can deteriorate. A crucible used for pulling a silicon ingot for semiconductor devices needs to meet with the aforementioned conditions. However, a crucible used for pulling a single crystal for a solar cell may contain a relatively large amount of alkali metals.

The thickness of the transparent vitreous silica layer 13 is preferred to be 0.5 mm or more. When the transparent vitreous silica layer 13 is thinner than 0.5 mm, the transparent vitreous silica layer 13 can be totally corroded during pulling a silicon single crystal, and thus the crucible body 11 can be exposed. The thickness of the transparent vitreous silica layer 13 does not have to be constant from the sidewall portion 11A to the bottom portion 11B, and for example, the thickness of the transparent vitreous silica layer 13 can be thicker at the corner portion 11C than the sidewall portion 11A and bottom portion 11B.

The reinforcement layer 14 is provided on the outer surface side of the upper end portion of the composite crucible 10. The reinforcement layer 14 is made of mullite material whose main component is alumina and silica. The reinforcement layer 14 is provided from the rim upper end to a point 5 to 10 cm below the rim upper end of the crucible.

Mullite is a material containing silicon dioxide ($SiO_2$) and aluminum oxide ($Al_2O_3$) in a predetermined ratio. Mullite is white and opaque material, and the melting point can vary dependent on the ratio of $SiO_2$ and $Al_2O_3$, but is approx. 1850 deg. C. Thus, mullite has larger strength at high temperature than vitreous silica. Mullite has larger viscosity at high temperature than vitreous silica. Thus, by use of mullite, the strength at high temperature of the overall crucible can be enhanced. Furthermore, mullite is cheaper than vitreous silica, and thus the use of mullite is advantageous in terms of cost.

The thermal expansion coefficient of mullite can vary dependent on the ratio of $SiO_2$ and $Al_2O_3$, but is known as 4.3 to 4.9 ($10^{-6}K^{-1}$). In contrast, the thermal expansion coefficient of $Al_2O_3$ is 7.8 and the thermal expansion coefficient of vitreous silica is 0.56. Although the thermal expansion coefficient of mullite is larger than vitreous silica, they can be readily combined. Therefore, it is possible to prevent detachment, due to difference in the thermal expansion coefficient, of the reinforcement layer 14 from the vitreous silica crucible body 11 by properly controlling the temperature during heating and cooling. However, in view of the aforementioned difference in the thermal expansion coefficient, the area of their interface is preferred to be as small as possible, and thus the reinforcement layer 14 is provided only on the rim upper end portion, not on the whole crucible.

The height $H_1$ of the reinforcement layer 14 is preferred to be 0.1 $H_2$ or more and 0.5 $H_2$ or less with respect to the height $H_2$ of the sidewall portion 11A of the crucible. When the height $H_1$ of the reinforcement layer 14 is 0.1 $H_2$ or less with respect to the height $H_2$ of the sidewall portion 11A of the crucible, the reinforcement layer 14 cannot properly exert the function, and thus there can occur inward sagging of the sidewall portion.

On the other hand, the crucible is accommodated in a graphite susceptor, the outer surface of the bottom portion 11B and the corner portion 11C of the crucible is supported by the graphite susceptor. Furthermore, the inner surface of the bottom portion 11B and the corner portion 11C of the crucible contacts silicon melt for a long time, and receives the weight of the silicon melt, and thus the bottom portion 11B and the corner portion 11C is unlikely to be deformed. Thus, reinforcement of the bottom portion 11B and the corner portion 11C is not very much necessary. In contrast, when the height $H_1$ of the reinforcement layer 14 is larger than 0.5 $H_2$, heat stress is applied to the crucible, during heating the crucible, due to the difference of the thermal expansion coefficients of mullite and vitreous silica, and thus cracks can be easily formed in the sidewall portion. Furthermore, aluminium contained in mullite is an impurity for a silicon crystal, and thus the use of mullite needs to be minimized. For these reasons, the height $H_1$ of the reinforcement layer 14 is preferred to be 0.5 $H_2$ or less.

Figure 2:
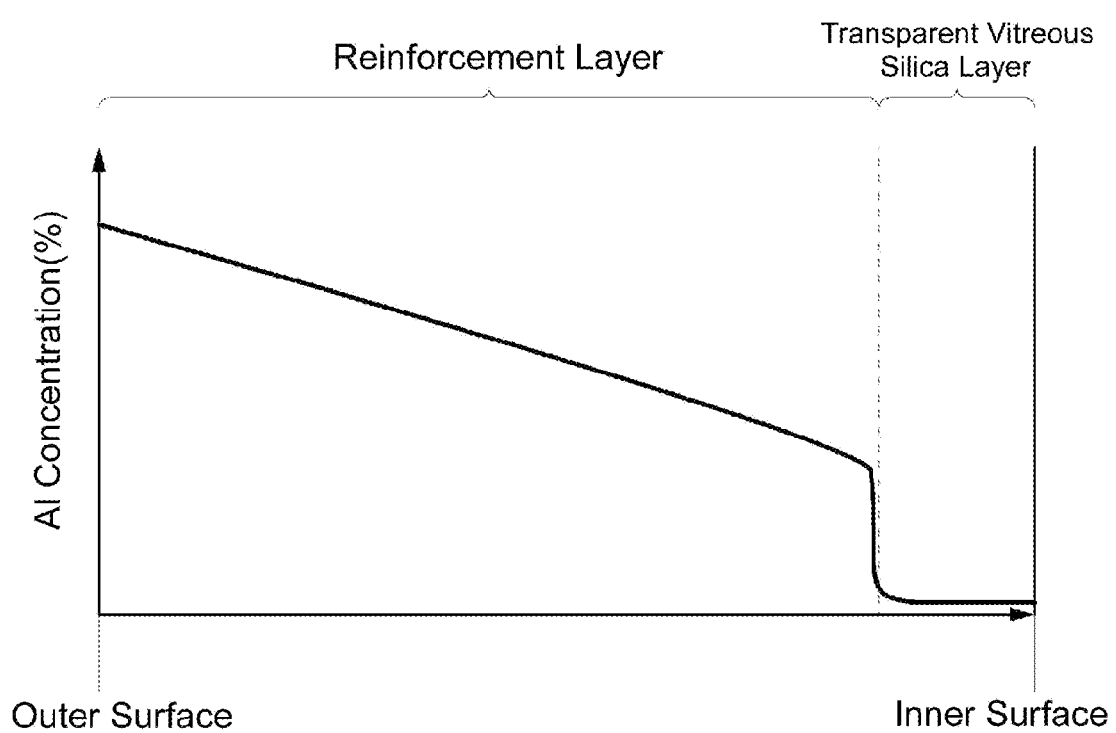
FIG. 2 is a graph showing Al concentration distribution with respect to the thickness direction of a reinforcement layer 14.

FIG. 2 is a graph showing Al concentration change with respect to the thickness direction of the reinforcement layer 14.

As shown in FIG. 2, Al concentration contained in the mullite reinforcement layer 14 may have concentration gradient which lowers from the outer surface toward the inner surface. When the reinforcement layer 14 is thus configured, the thermal expansion coefficient of the reinforcement layer 14 near the crucible inner surface side of the crucible body 11 becomes closer to that of vitreous silica, and thus detachment therebetween due to difference of the thermal expansion coefficients can be prevented. Thus, the bonding therebetween can be enhanced. Furthermore, when the Al concentration on the inner surface side of the crucible is low and thus the contamination, by Al, of the silicon melt within the crucible can be prevented.

According to the composite crucible 10 of the present embodiment, a reinforcement member made of mullite is used to reinforce the crucible body 11 made of vitreous silica, and thus the composite crucible 10 has better durability at high temperature than a conventional vitreous silica crucible. Therefore, the use of the composite crucible 10 enables multi-pulling where plural silicon single crystals are pulled from a single crucible by re-charging silicon material, and thus drastically reduces the production cost for silicon single crystals. Furthermore, most portion of the composite crucible 10 is made of vitreous silica, and thus the composite crucible 10 can be handled in the same way as the conventional vitreous silica crucible, and thus it is not necessary to largely change the temperature control conditions during pulling a silicon single crystal.

The composite crucible 10 having the mullite reinforcement layer 14 on the upper end portion of the crucible contains impurities (Al) in a higher concentration than a crucible made of only vitreous silica, and thus the composite crucible 10 is not necessarily appropriate for pulling a silicon single crystal for semiconductor devices. However, the crucible inner surface contacting silicon melt is covered with a transparent vitreous silica layer, and thus the release of impurities is suppressed to some extent. Therefore, the composite crucible 10 is appropriate for pulling a silicon single crystal for use having large tolerance in terms of impurities, such as for use in a solar cell. Furthermore, mullite is cheaper than silica material, and thus the use of mullite is advantageous in terms of cost. Therefore, the use of mullite enables production of silicon wafer at lower cost.

Next, with reference to FIGS. 3 and 4, the method of manufacturing the composite crucible 10 will be explained.

Figure 3:
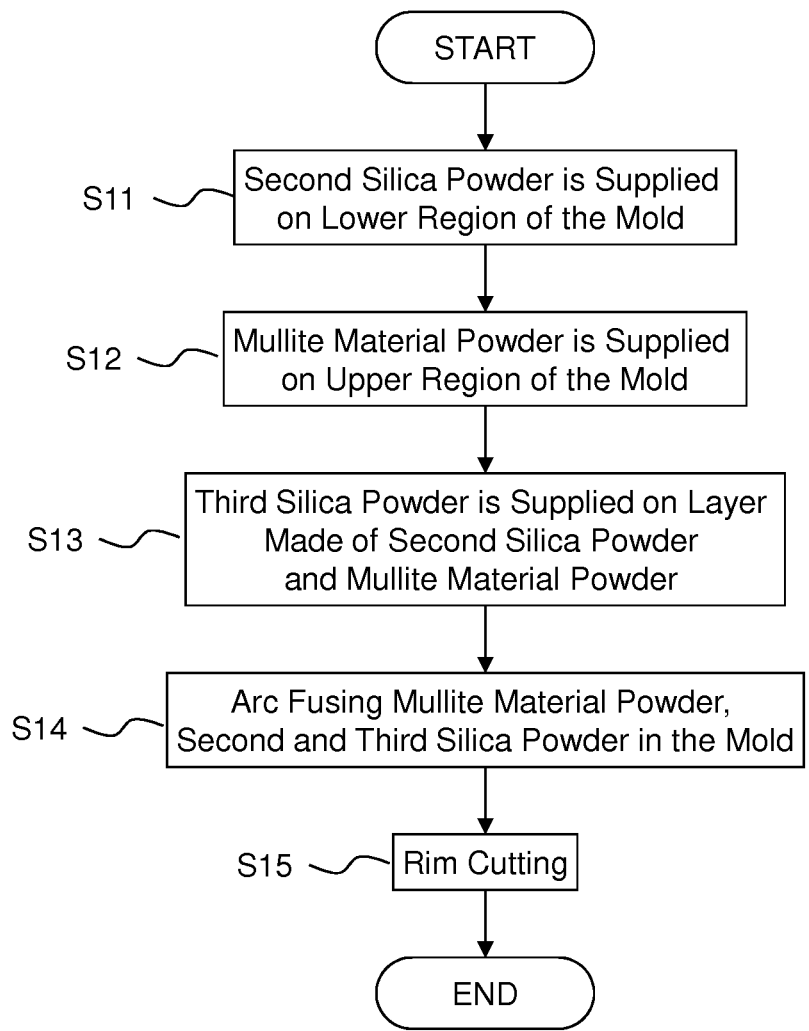
FIG. 3 is a flowchart for schematically explaining an exemplary method of manufacturing a composite crucible 10.
Figure 4A:
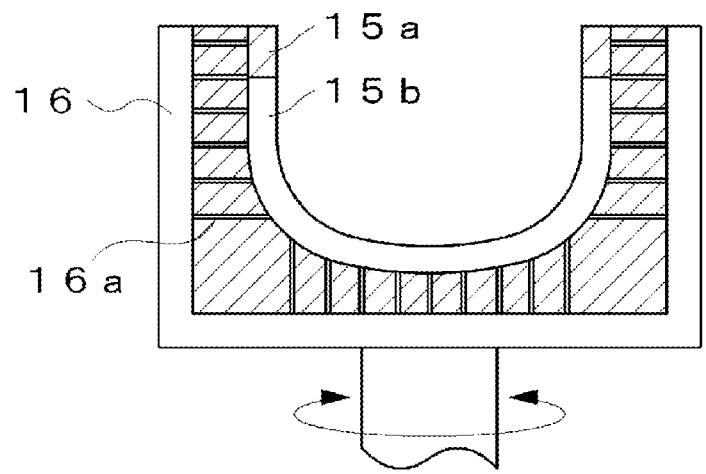
FIGS. 4(a) to (c) are sectional views for schematically explaining an exemplary method of manufacturing a composite crucible 10.
Figure 4B:
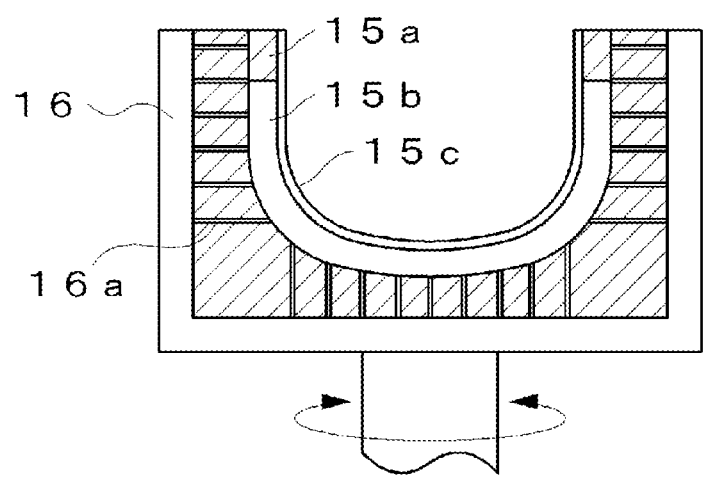
Figure 4C:
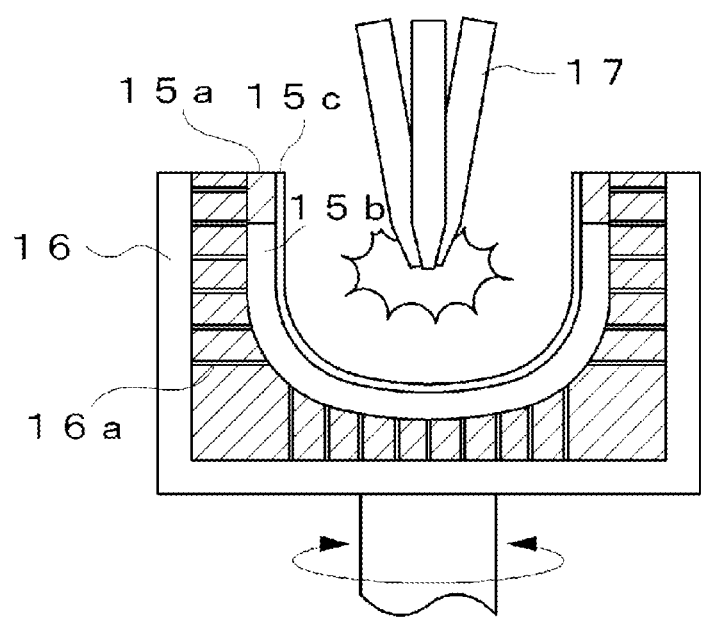

FIG. 3 is a flowchart for schematically explaining a method of manufacturing the composite crucible 10. FIGS. 4(a) to (c) are sectional views for schematically explaining a method of manufacturing the composite crucible 10. The composite crucible 10 can be manufactured by use of the rotating mold method. In the rotating mold method, as shown in FIG. 4(a), a carbon mold having a cavity coinciding with the outer shape of the crucible is used to supply crucible material powder therein while rotating the mold, to form a material powder layer along the inner surface of the mold. In this process, the mullite material powder 16a is supplied on the cavity upper region corresponding to the upper end portion of the crucible, and silica powder (second silica powder) 15b is supplied on a region lower than the upper region. In particular, silica powder 15b is first supplied (Step S11), and thereafter mullite material powder 15a is supplied (Step S12). The carbon mold 16 is rotated at a constant speed, and thus a centrifugal force is applied to the supplied material powder to maintain the shape on the inner surface.

Mullite material powder 15a is material powder obtained by mixing alumina powder and silica powder (first silica powder), for example, in the ratio of 3:2 in element ratio. When the Al concentration in the reinforcement layer is desired to be changed in the thickness direction of the crucible as shown in FIG. 2, plural kinds of mullite material powder different in the ratio of alumina powder and silica powder may be prepared and supplied into the mold. As the silica powder 15b, natural silica powder is preferred to be used.

Next, as shown in FIG. 4(b), silica powder 15c (third silica powder) which is the material of the transparent vitreous silica layer 13 is supplied in the mold 16 having a layer of mullite material powder 15a and silica powder 15b which are the material for the opaque vitreous silica layer 12, to increase the thickness of the silica powder layer (Step S13). Silica powder 15c is supplied into the mold so as to form a layer with a certain thickness. Silica powder 15c may be natural silica powder or synthetic silica powder.

Thereafter, as shown in FIG. 4(c), arc electrodes 17 are disposed in the cavity to heat the inside of the mold to 1720 deg. C. or more to arc fuse the material powder (Step S14). Furthermore, during the heating, the silica powder layer is depressurized via ventilation holes provided in the mold, to remove bubbles in the crucible inner surface and thus to form a transparent vitreous silica layer 13. Thereafter, the depressurization is weakened or terminated during heating to leave bubbles in the silica powder layer, to form an opaque vitreous silica layer containing numerous microbubbles. In this process, numerous microbubbles stays in the reinforcement layer 14, too. Thereafter, the rim of the crucible was cut off so that the upper end of the crucible becomes flat (Step S15). Thus, the composite crucible 10 according to the present embodiment is manufactured.

Thus, according to the method of manufacturing a composite crucible of the present embodiment, the mullite reinforcement layer is formed together with the silica powder layer by arc fusing, and thus a high-quality crucible having high durability at high temperature can be manufactured efficiently while maintaining the quality of a conventional vitreous silica crucible.

Next, the composite crucible according to the second embodiment of the present invention will be explained in detail.

Figure 5:
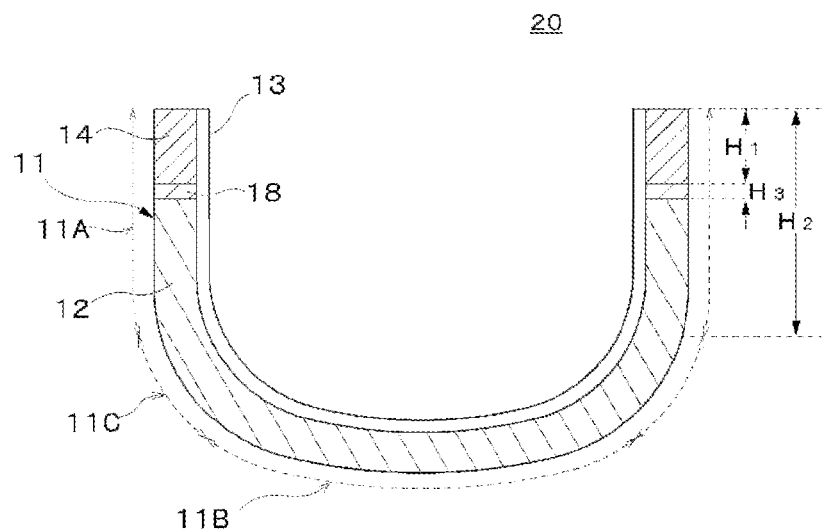
FIG. 5 is a sectional view schematically showing the structure of a composite crucible 20 according to a second embodiment of the present invention.

FIG. 5 is a sectional view schematically showing the structure of the composite crucible according to a second embodiment of the present invention.

As shown in FIG. 5, the composite crucible 20 of the present embodiment is characterized in that a buffer layer 18 is provided between the opaque vitreous silica layer 12 and the reinforcement layer 14 disposed above the opaque vitreous silica layer 12. The buffer layer 18 is a layer in which the Al concentration of the mullite reinforcement layer 14 gradually decreases from the above to the below. The buffer layer 18 has concentration gradient in the vertical direction, which is in contrast to the concentration gradient in the thickness direction of the case shown in FIG. 2. According to this configuration, the difference of the thermal expansion coefficients between the opaque vitreous silica layer 12 and the mullite reinforcement layer 14 is reduced, and thus cracks caused by heat stress in the interface therebetween can be prevented.

Figure 6:
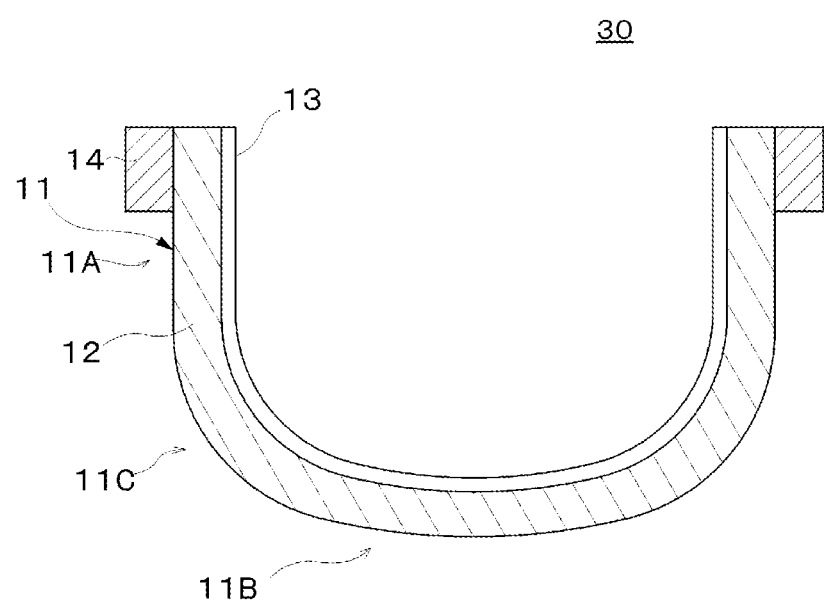
FIG. 6 is a sectional view schematically showing the structure of a composite crucible 30 according to a third embodiment of the present invention.

FIG. 6 is a schematic sectional view showing the structure of a composite crucible according to a third embodiment of the present invention.

As shown in FIG. 6, the composite crucible 30 of the present embodiment is characterized in that the mullite reinforcement layer 14 is provided on the outer side of the vitreous silica crucible body 11. Therefore, the reinforcement layer 14 is in contact with the outer surface of the opaque vitreous silica layer 12 which constitutes the outer layer of the vitreous silica crucible body 11. The reinforcement layer 14 is provided by preparing a ring-shaped member separately from the vitreous silica crucible body 11, and joining the ring-shaped member with the outer surface of the vitreous silica crucible for integration. Other configuration is substantially the same the composite crucible 10 of the first embodiment, and thus the same references are assigned to the same components, and the explanation is not repeated.

Figure 7:
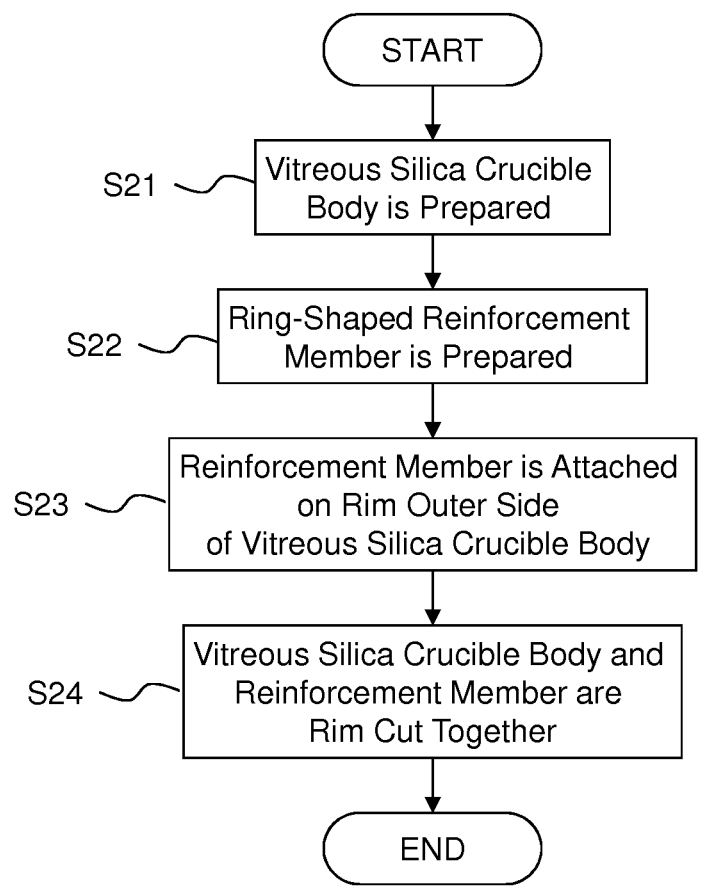
FIG. 7 is a flowchart for schematically explaining an exemplary method of manufacturing the composite crucible 30.

FIG. 7 is a flowchart for explaining a method of manufacturing the composite crucible 30.

As shown in FIG. 7, in manufacturing the composite crucible 30, the vitreous silica crucible body 11 is first prepared (Step S21). The vitreous silica crucible body 11 can be prepared by the aforementioned rotating mold method. Unlike the first embodiment, the opaque vitreous silica layer 12 is formed up to the rim upper end, but other configuration is substantially identical.

Next, a mullite ring-shaped reinforcement member, which will be the reinforcement layer 14, is prepared (Step S22). The mullite reinforcement member can be prepared, for example, by the slip casting method. The slip casting method is well known as a method of forming a ceramic sintered body. Usually, a mold made of a material having good water absorbability such as plaster is used. Slurry (suspension of ceramic powder, also referred to as "slip") is injected into a cavity in the mold, and water in the slurry is absorbed to solidify the slurry. The obtained molded body is subjected to a degreasing process, and thereafter fired to obtain the final product. The method is, in general, appropriate for manufacturing a molded body having a complex shape, but takes long time to manufacture a molded body having a large wall thickness. Thus, also known is the compression molding technique in which the slip casting molding method is carried out while pressure is applied to slurry. According to the slip casting compression molding method, slurry is forcedly dewatered, and thus a molded body having a relatively thick wall can be manufactured.

When the ring-shaped reinforcement member is molded by use of the slip casting method, slurry is first prepared by dispersing, in water, alumina powder and silica powder (material for mullite) in a certain ratio, and thereafter the slurry is further dispersed after a crystallization promoter is added thereto. Furthermore, the slurry is supplied into a mold and dewatered to obtain a molded body whose main component is alumina and silica. In the present embodiment, it is preferred that the mold is attached to a rotating axis, and is rotated to forcedly dewater the slurry. Next, the molded body solidified by the dewatering is dried for a certain period, and subjected to a degreasing process, and thereafter fired at 1400 deg. C., to obtain the mullite reinforcement member.

Next, the ring-shaped reinforcement member is attached on the outer side of the rim upper end portion of the vitreous silica crucible body 11 to join them (Step S23). Thus, the reinforcement layer 14 is formed on the outer side of the vitreous silica crucible body 11. Thereafter, the vitreous silica crucible body 11 and the reinforcement layer 14 are together subjected to the rim cutting process so that the upper end of the crucible is flat (Step 24). It is possible to obtain a flat upper end by adjusting the height position of the reinforcement layer with respect to the vitreous silica crucible body 11. However, the height adjustment is difficult, and thus it is better to obtain the flat upper end by rim cutting them together. Thus, the composite crucible 30 of the present embodiment is obtained.

The present invention is not in particular limited, and can be modified as long as the modification does not depart from the spirits of the present invention, and the modification is incorporated in the present invention.

EXAMPLE

Example 1

Sample A1 of the composite crucible was prepared. The crucible had a diameter of 16 inches (opening diameter of about 400 mm), a height of the 250 mm. The wall thickness of the crucible was 6.5 mm at the straight body portion, 8 mm at the corner portion, and 5 mm at the bottom portion. The thicknesses of the transparent vitreous silica layer and the opaque vitreous silica layer at the sidewall portion were 0.5 mm and 6 mm, respectively. Furthermore, a mullite reinforcement layer was provided on the upper end portion of the crucible. The height $H_2$ of the sidewall portion was 150 mm and the height $H_1$ of the reinforcement layer was about 15 mm ($H_1$=0.1 $H_2$).

Next, Crucible Sample A1 was heated for a long time in a furnace, and the deformation state of the crucible was observed. The heating conditions were as follows. First the temperature was increased at a constant rate from the room temperature to about 1580 deg. C. over 5 hours, and the temperature was maintained at 1580 deg. C. for 25 hours. Thereafter, the temperature was decreased to 1500 deg. C., and the temperature was maintained at 1500 deg. C. for 100 hours. Thereafter, the temperature was decreased at a constant rate to the room temperature over 7 hours.

The heating test was carried out in a state that no silicon material was in the crucible. In a normal use of the crucible, silicon material is supplied in the crucible, and thus the crucible wall is pressed from the inside by silicon melt. When no silicon material is in the crucible, inward sagging of the sidewall portion of the crucible is more likely to occur. This state is similar to the state after most portion of silicon melt in the crucible is consumed by pulling a silicon single crystal. The result of the heating test is shown in Table 1.

As shown in Table 1, deformation such as inward sagging and buckling was not visually observed in the aforementioned heating test in Crucible Sample A1 having the mullite reinforcement layer having a height of 15 mm formed on the outer surface side of the crucible upper end portion. In addition, there was no crack on the sidewall portion.

Example 2

Crucible Sample A2 having the same structure except that the height $H_1$ of the reinforcement layer was about 50 mm ($H_1 \approx 0.33\ H_2$) was prepared and subjected to the same heating test as in Example 1. As shown in Table 1, deformation such as inward sagging and buckling was not visually observed, and there was no crack on the sidewall portion.

Example 3

Crucible Sample A3 having the same structure except that the height $H_1$ of the reinforcement layer was about 75 mm ($H_1$=0.5 $H_2$) was prepared and subjected to the same heating test as in Example 1. As shown in Table 1, deformation such as inward sagging and buckling was not visually observed, and there was no crack on the sidewall portion.

Example 4

Crucible Sample A4 having the same structure except that the height $H_1$ of the reinforcement layer was about 100 mm ($H_1 \approx 0.67\ H_2$) was prepared and subjected to the same heating test as in Example 1. As shown in Table 1, deformation such as inward sagging and buckling was not visually observed, but there were many cracks on the sidewall portion.

Example 5

Crucible Sample A5 having the same structure except that the height $H_1$ of the reinforcement layer was about 10 mm ($H_1 \approx 0.067\ H_2$) was prepared and subjected to the same heating test as in Example 1. As shown in Table 1, inward sagging and buckling occurred slightly.

Example 6

Crucible Sample A6 having the same structure except that the height $H_1$ of the reinforcement layer was about 100 mm ($H_1 \approx 0.67 H_2$) was prepared and subjected to the same heating test as in Example 1. As shown in Table 1, deformation such as inward sagging and buckling was not visually observed, and there was no crack on the sidewall portion.

Comparative Example 1

Sample B1 of a conventional vitreous silica crucible was prepared. The crucible had a transparent vitreous silica layer on the inner surface side, and an opaque vitreous silica layer on the outer surface side. The crucible had a diameter of 16 inches (opening diameter about 400 mm), a height of the 250 mm. The wall thickness of the crucible was 6.5 mm at the straight body portion, 8 mm at the corner portion, and 5 mm at the bottom portion. The thicknesses of the transparent vitreous silica layer and the opaque vitreous silica layer at the sidewall portion were 0.5 mm and 6 mm, respectively. Sample B1 was subjected to the same heating test as in Example 1. The result is shown in Table 1.

As shown in Table 1, in Sample B1 which is a conventional vitreous silica crucible, inward sagging and buckling occurred after long-time heating, and the roundness largely deteriorated.

TABLE 1

| Crucible Sample | Height of Sidewall Portion $H_2$ (mm) | Height of Reinforcement Layer $H_1$ (mm) | Ratio of Height $H_1/H_2$ (mm) | Buffer Layer (mm) | State of Heating |
|---|---|---|---|---|---|
| Ex. 1 (A1) | 150 | 15 | 0.1 | None | No Deformation No Crack |
| Ex. 2 (A2) | 150 | 50 | 0.33 | None | No Deformation No Crack |
| Ex. 3 (A3) | 150 | 75 | 0.5 | None | No Deformation No Crack |
| Ex. 4 (A4) | 150 | 100 | 0.67 | None | No Deformation Many Crack |
| Ex. 5 (A5) | 150 | 10 | 0.067 | None | Slight Deformation |
| Ex. 6 (A6) | 150 | 100 | 0.67 | 25 | No Deformation No Crack |
| Comp. Ex. 1 (B1) | 150 | 0 | 0 | None | Large Deformation |

Explanation of Reference Symbol
10 Composite Crucible
11 Vitreous Silica Crucible Body
11A Sidewall Portion
11B Bottom Portion
11C Corner Portion
12 Opaque Vitreous Silica Layer 13 Transparent Vitreous Silica Layer
14 Reinforcement Layer
15a Mullite Material Powder
15b Silica Powder (Second Silica Powder)
15c Silica Powder (Third Silica Powder)
16 Carbon Mold
17 Arc Electrodes
18 Buffer Layer
20 Composite Crucible

What is claimed is:

1. A composite crucible comprising:
a vitreous silica crucible body having a sidewall portion and a bottom portion, and
a reinforcement layer provided on an outer surface side of an upper end portion of the vitreous silica crucible body, wherein the reinforcement layer is made of mullite material whose main component is alumina and silica, wherein
the vitreous silica crucible body has an opaque vitreous silica layer provided on an outer surface side of the crucible and containing numerous microbubbles, and a transparent vitreous silica layer provided on an inner surface side of the crucible;
the reinforcement layer constitutes a same layer as the opaque vitreous silica layer with respect to a wall thickness direction of the crucible; and
the transparent vitreous silica layer constitutes a crucible inner layer covering and contacting an inner surface of the opaque vitreous silica layer and an inner surface of the inner surface of the reinforcement layer.

2. The composite crucible of claim 1, wherein the height of the reinforcement layer is 1/10 to 1/2 of the height of the sidewall portion.

3. The composite crucible of claim 1, further comprising a buffer layer between the reinforcement layer and the vitreous silica crucible body, and the buffer layer having concentration gradient of aluminium concentration which decreases from the above to the below of the crucible.

* * * * *